United States Patent
Xu et al.

(10) Patent No.: US 10,347,835 B2
(45) Date of Patent: Jul. 9, 2019

(54) LAYER STRUCTURE, MANUFACTURING METHOD THEREOF, DISPLAY SUBSTRATE, BACKLIGHT AND DISPLAY DEVICE

(71) Applicant: BOE TECHNOLOGY GROUP CO., LTD., Beijing (CN)

(72) Inventors: Wei Xu, Beijing (CN); Jikai Yao, Beijing (CN); Kang Guo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 35 days.

(21) Appl. No.: 15/509,411

(22) PCT Filed: Aug. 26, 2016

(86) PCT No.: PCT/CN2016/096821
§ 371 (c)(1),
(2) Date: Mar. 7, 2017

(87) PCT Pub. No.: WO2017/121122
PCT Pub. Date: Jul. 20, 2017

(65) Prior Publication Data
US 2017/0346008 A1    Nov. 30, 2017

(30) Foreign Application Priority Data

Jan. 15, 2016    (CN) .......................... 2016 1 0028987

(51) Int. Cl.
*C03C 15/00*    (2006.01)
*H01L 51/00*    (2006.01)
(Continued)

(52) U.S. Cl.
CPC .... *H01L 51/0004* (2013.01); *G02F 1/133516* (2013.01); *G02F 1/133621* (2013.01);
(Continued)

(58) Field of Classification Search
CPC ............... H01L 27/322; H01L 27/3244; H01L 2224/80014; H01L 2224/81014; H01L 2224/83014; B81C 1/00388
USPC ......................................... 216/24, 25, 41, 73
See application file for complete search history.

(56) References Cited

U.S. PATENT DOCUMENTS

| 3,849,528 A | 11/1974 | Smith |
| 6,451,372 B2 | 9/2002 | Hasegawa et al. |

(Continued)

FOREIGN PATENT DOCUMENTS

| CN | 1312469 A | 9/2001 |
| CN | 101539721 A | 9/2009 |

(Continued)

OTHER PUBLICATIONS

International Search Report of PCT/CN2016/096821 in Chinese, dated Nov. 30, 2016 with English translation.
(Continued)

*Primary Examiner* — Binh X Tran
(74) *Attorney, Agent, or Firm* — Collard & Roe, P.C.

(57) ABSTRACT

A layer structure, a manufacturing method thereof, a display substrate, a backlight and a display device are provided. The manufacturing method includes forming a layer solution on a substrate (21); solidifying the layer solution by lowering the temperature of the layer solution; and forming the layer structure by removing a solvent in the solidified layer solution via a sublimation process.

11 Claims, 2 Drawing Sheets

(51) Int. Cl.
    *G02F 1/1335*     (2006.01)
    *H01L 27/32*     (2006.01)
    *G02F 1/1368*     (2006.01)
    *G02F 1/1362*     (2006.01)
    *H01L 51/50*     (2006.01)

(52) U.S. Cl.
    CPC .......... *H01L 27/322* (2013.01); *G02F 1/1368* (2013.01); *G02F 2001/133614* (2013.01); *G02F 2001/136222* (2013.01); *G02F 2202/36* (2013.01); *H01L 27/3244* (2013.01); *H01L 51/502* (2013.01); *H01L 2227/323* (2013.01)

(56) References Cited

U.S. PATENT DOCUMENTS 8,357,618 B2     1/2013     Bencher et al.
2012/0301360 A1*     11/2012     Meinhold .......... B01J 20/28047
                                                                                                                        422/68.1
2012/0304483 A1*     12/2012     Sirard ............... H01L 21/02057
                                                                                                                          34/289
2014/0179097 A1*     6/2014     Hymes ............. H01L 21/76877
                                                                                                                          438/610

FOREIGN PATENT DOCUMENTS

| CN | 105467682 A | 4/2016 |
|---|---|---|
| GB | 2 430 435 A | 3/2007 |
| JP | 2006-281189 A | 10/2006 |

OTHER PUBLICATIONS

Notice of Transmittal of the International Search Report of PCTICN2016/096821 in Chinese, dated Nov. 30, 2016.

Written Opinion of the International Searching Authority of PCT/CN2016/096821 in Chinese, dated Nov. 30, 2016 with English translation.

* cited by examiner

LAYER STRUCTURE, MANUFACTURING METHOD THEREOF, DISPLAY SUBSTRATE, BACKLIGHT AND DISPLAY DEVICE

CROSS REFERENCE TO RELATED APPLICATIONS

This application is the National Stage of PCT/CN2016/096821 filed on Aug. 26, 2016, which claims priority under 35 U.S.C. § 119 of Chinese Application No. 201610028987.7 filed on Jan. 15, 2016, the disclosure of which is incorporated by reference.

TECHNICAL FIELD

Embodiments of the present disclosure relate to a layer structure, a manufacturing method thereof, a display substrate, a backlight and a display device.

BACKGROUND

In the field of display technology, the method for manufacturing layers in display devices includes inkjet printing, micro-transfer printing, spin-coating, or the like. When the method, such as inkjet printing, is used in manufacturing the layers, a layer solution must be dried to remove a solvent therein. Generally, the solvent is converted from liquid into gas by roasting and film forming of the layer solution via a traditional thermal evaporation process. However, due to the "coffee ring" effect, the formed layers will be thin in the middle and thick on both sides, namely the layers are non-uniform.

SUMMARY

According to a method for manufacturing a layer structure, including: forming a layer solution on a substrate; solidifying the layer solution by lowering the temperature of the layer solution; and forming the layer structure by removing a solvent in the solidified layer solution via a sublimation process.

For example, the method further including forming a layer solution provided with a pattern on the substrate.

For example, the method further including: after forming the layer structure by removing the solvent in the solidified layer solution via the sublimation process, forming a pattern by etching the layer structure via a patterning process.

For example, the method further including forming the layer solution on the substrate by inkjet printing or roll-to-roll printing.

For example, the method further including forming the layer structure by removing the solvent in the layer solution via the sublimation of the solidified layer solution in a vacuum.

For example, the vacuum degree of the vacuum is 0.1-20 mbar.

For example, the method further including raising the temperature of the layer solution, the raised temperature being lower than the solidifying point of the layer solution.

For example, the layer solution is a quantum dot solution.

For example, the solvent in the layer solution at least includes one solvent from water, ethanol or glycerin.

For example, the lowered temperature of the layer solution is in a range from 0 to 50 Celsius degrees.

A layer structure manufactured by the method.
A display substrate including the layer structure.
A backlight including the layer structure.

A display device including at least one of the display substrate, or the backlight.

BRIEF DESCRIPTION OF THE DRAWINGS

Embodiments of the present disclosure will be described in detail hereinafter in conjunction with accompanying drawings to allow one of ordinary skill in the art to understand the present disclosure more clearly, in which.

BRIEF DESCRIPTION

Technical solutions according to the embodiments of the present disclosure will be described clearly and fully as below in conjunction with the accompanying drawings of embodiments of the present disclosure. It is apparent that the described embodiments are just a part but not all of the embodiments of the disclosure. Based on the described embodiments herein, those skilled in the art can obtain other embodiment(s), without any creative work, which shall be within the scope of the present disclosure.

Quantum dots have the characteristics of adjustable luminous color and high color purity, which are applied in backlight sources of a liquid crystal display (LCD) panel, and may also be applied in color filters (CFs) and organic light-emitting diode (OLED) display devices in the field of future display technology. Particularly it may be applied in developing a display panel with high color gamut and low energy consumption. The inventor has noticed that when the inkjet printing method is adopted for manufacturing quantum dot layers, the quantum dot layers can be patterned and the utilization rate of materials can be high, so that the cost can be greatly reduced and the production efficiency can be improved. However, in the roasting and film forming process via thermal evaporation, due to the "coffee ring" effect, the formed quantum dot layers will be thin in the middle and thick on both sides of pixel regions, so that the effective area of the pixel regions can be reduced, and the image display quality and the service life of the display panel can be affected.

More detailed description will be given below to the layer structure, the manufacturing method thereof, the display substrate, the backlight and the display device, provided by the present disclosure with reference to the accompanying drawings and the embodiments.

Figure 1:
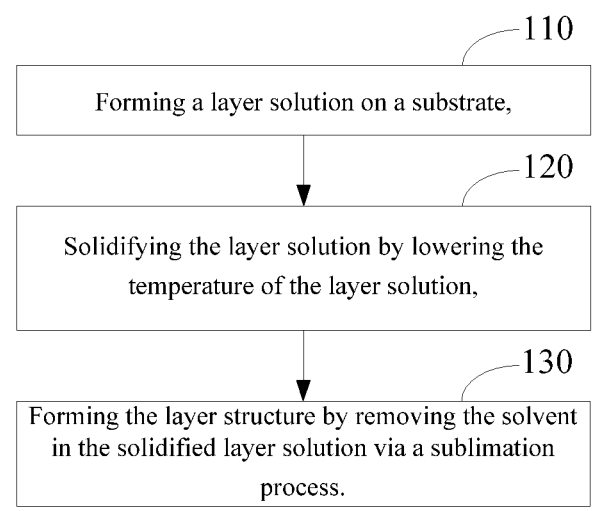
FIG. 1 is a flowchart of a method for manufacturing a layer structure, provided by an embodiment of the present disclosure.

As illustrated in FIG. 1, an embodiment of the present disclosure provides a method for manufacturing a layer structure, which includes steps as below.

S110: forming a layer or film solution on a substrate.

S120: solidifying the layer solution by lowering the temperature of the layer solution.

The temperature of the layer solution is lowered to be lower than the solidifying point of a solvent in the layer solution.

S130: forming the layer structure by removing the solvent in the solidified layer solution via a sublimation process.

In the embodiment of the present disclosure, in the process of forming the layer structure, after the layer solution is formed on the substrate, the temperature of the layer solution is lowered at first for low-temperature solidification, then, the solvent in the solidified layer solution is removed by the sublimation process. Compared with the roasting and film forming process via a thermal evaporation process, the phenomenon of "coffee ring" is eliminated, so that the formed layer structure has a uniform thickness, and the uniformity of the formed layer structure (e.g., a quantum dot layer) can be improved.

For instance, the step of forming the layer solution on the substrate in the step S110 includes forming a layer solution provided with a pattern on the substrate.

In the embodiment, the formed layer solution has a pattern, and the layer structure provided with the pattern is obtained after a sublimation process.

For instance, the step of forming the layer solution on the substrate in the step S110 includes forming an entire layer of layer solution on the substrate.

Correspondingly, the method further includes: after the step of forming the layer structure by removing the solvent in the solidified layer solution via a sublimation process in the step S130, forming a pattern by etching the layer structure via a patterning process.

In the embodiment, as an entire layer of layer solution is formed on the substrate and no pattern is provided, the pattern of the layer structure is formed by the patterning process after the sublimation process.

For instance, in the above embodiments, in the process of forming the layer solution on the substrate, the layer solution may be formed on the substrate by inkjet printing or transfer printing.

To further improve the uniformity of the formed layer structure, for instance, the step of forming the layer structure by removing the solvent in the solidified layer solution via the sublimation process in the step S130 includes forming the layer structure by removing the solvent in the layer solution via the sublimation of the solidified layer solution in a vacuum.

In the embodiment, as the sublimation process is performed in the vacuum, the diffusion of molecules in the solidified layer solution can be reduced, so that the thickness of the solidified layer solution can be kept constant as much as possible in the sublimation process, and the uniformity of the formed layer structure can be improved.

For instance, in the embodiment, the vacuum degree of the vacuum is 0.1-20 mbar.

If the sublimation process is performed in the vacuum, a vacuum environment may be provided by a vacuum freeze drier.

To improve the sublimation speed, for instance, the step of forming the layer structure by removing the solvent in the solidified layer solution via the sublimation process includes raising the temperature of the layer solution, in which the raised temperature is lower than the solidifying point of the solvent in the layer solution.

In the embodiment, as the temperature of the layer solution is raised, the sublimation process can be accelerated, so that the production efficiency can be improved. Moreover, the raised temperature is lower than the solidifying point of the solvent in the layer solution, so that the layer solution can be kept in the solidified state.

It is noted that in the manufacturing process, all the layer structures affected by the "coffee ring" effect can adopt the manufacturing method provided by the embodiments of the present disclosure.

For instance, the layer or film structure includes but not limited to a quantum dot layer or film. Correspondingly, the layer solution can be a quantum dot solution.

Quantum dots in the layer solution may be aqueous-phase quantum dots and may also be oil-phase quantum dots.

For instance, a possible layer solution is formed by aqueous-phase quantum dots, an additive and a solvent.

The quantum dots may adopt ZnSe-based, InP-based, $CuInS_2$-based and CdSe-based core/shell structure quantum dots with the quantum yield of greater than 90%.

Surfaces of the quantum dots are modified with acid, ammonia or other ligands. The ligands have good water solubility.

The additive may be organic molecules, such as hydrophilic alcohol type, ester type, or water-oil amphiphilic surfactant, and has the function of adjusting the viscosity of the layer solution and reducing the surface tension of the layer solution.

For instance, the solvent in the layer solution at least includes one solvent among water, ethanol, and glycerin.

For instance, in the embodiment, the lowered temperature of the layer solution is in a range from 0 to 50 Celsius degrees.

Based on the same disclosure concept, the embodiments of the present disclosure also provide a layer structure. The layer structure is manufactured by the method provided by any foregoing embodiment.

The layer structure may be applied in an liquid crystal display (LCD) and may also be applied in a quantum light-emitting diode (QLED) display, or the like.

More detailed description will be given below to the layer structure and the manufacturing method thereof, provided by an embodiment of the present disclosure, by taking the quantum dot layer as an example.

Figure 2A:
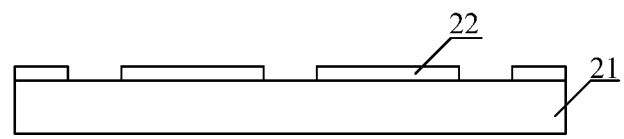
FIGS. 2a to 2e are schematic structural views in a manufacturing process of a layer structure provided by an embodiment of the present disclosure.

In the embodiment, the method for manufacturing the quantum dot layer includes the following steps:

S1: as illustrated in FIG. 2a, forming a plurality of pixel electrodes 22 on a substrate 21.

The substrate 21 may be a thin-film transistor (TFT) substrate. The material of the substrate may be low-temperature poly-silicon (LTPS) or indium gallium zinc oxide (IGZO). The substrate is manufactured by a conventional process.

Figure 2B:
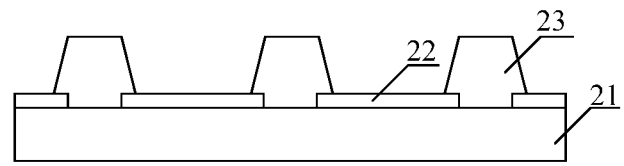

S2: as shown in FIG. 2b, forming a patterned pixel define layer (PDL) 23 on the substrate 21 provided with the pixel electrodes 22. The pattern of the patterned PDL 23 allows the pixel electrodes 22 to be partially exposed. Exposed areas of the pixel electrodes 22 are pixel regions.

In the patterned PDL 23, for instance, sections of the exposed pixel electrodes 22 are regular trapezoidal structure, or may be inverted trapezoidal structures. The patterned PDL 23 is formed by plasma enhanced chemical vapor deposition (PECVD). The patterned PDL 23 is prepared by photoresist coating, exposure, development and etching process.

Figure 2C:
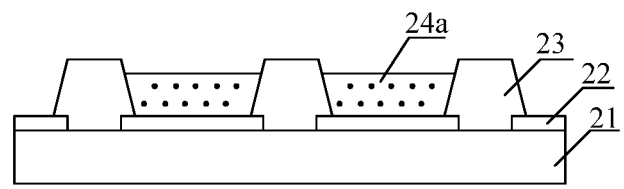

S3: as shown in FIG. 2c, injecting quantum dot ink 24a (namely the layer solution) into the pixel regions on the substrate 21 by inkjet printing.

In the step, quantum dot ink 24a provided with a pattern is formed on the substrate 21.

The quantum dot ink 24a is formed by aqueous-phase quantum dots, an additive and a solvent, and can satisfy the roasting temperature of less than 100 Celsius degrees.

The quantum dots are ZnSe-based and CdSe-based core/shell structure quantum dots with the quantum yield of greater than 90%, and include red quantum dots, green quantum dots, and blue quantum dots. The emission wavelength of the red quantum dots is 610 nm-700 nm; the emission wavelength of the green quantum dots is 500 nm-560 nm; the emission wavelength of the blue quantum dots is 400 nm-470 nm; and the full width at half maximum (FWHM) of the emission spectrum of the quantum dots is 15 nm-50 nm.

Surfaces of the quantum dots are modified with acid type, ammonia type or other types of ligands. The ligands have good water solubility.

The additive may be organic molecules, such as hydrophilic alcohol, ester, or water-oil amphiphilic surfactant, and has the function of adjusting the viscosity of the layer solution and reducing the surface tension of the layer solution.

The solvent in the quantum dot ink is one or a mixture of material selected from water, ethanol, and glycerin.

Figure 2D:
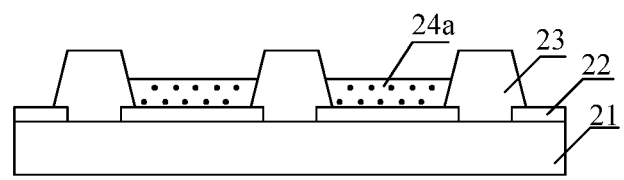

S4: as shown in FIG. 2d, solidifying the quantum dot ink by lowering the temperature of the quantum dot ink 24a in the pixel regions.

The temperature of the quantum dot ink is lower than the solidifying point of the solvent in the quantum dot ink. The lowered temperature of the quantum dot ink is in a range from 0 to 50 Celsius degrees.

Figure 2E:
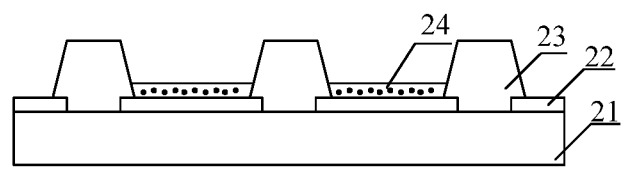

S5: forming the quantum dot layer, namely a quantum dot layer 24 as shown in FIG. 2e, by raising the temperature of the solidified quantum dot ink 24a in a vacuum and sublimating the solvent in the quantum dot ink 24a. The raised temperature is lower than the solidifying point of the solvent in the quantum dot ink.

The step can be implemented in a vacuum freeze drier. The vacuum degree of the vacuum is 0.1-20 mbar.

As can be seen in FIG. 2e, in the embodiment, the finally obtained quantum dot layer 24 has a uniform thickness, so that the quality of the quantum dot layer can be improved. If the quantum dot layer 24 is applied in a display panel, the aperture ratio, the resolution, the color gamut, the brightness uniformity of the pixel regions, and the like of the display panel can be improved, and the image display quality and the service life of the display panel can be improved.

Based on the same concept, the embodiments of the present disclosure also provide a display substrate, which includes the layer structure provided by any foregoing embodiment.

For instance, the display substrate may include but not limited to a color filter (CF) substrate and an array substrate.

Based on the same disclosure concept, the embodiments of the present disclosure also provide a backlight source, which includes the layer structure provided by any foregoing embodiment.

For instance, the backlight source includes but not limited to a quantum dot light source.

Based on the same concept, the embodiments of the present disclosure also provide a display device, which includes at least one of the display substrate provided by any foregoing embodiment or the backlight provided by any foregoing embodiment.

In the layer structure, the manufacturing method thereof, the display substrate, the backlight and the display device, provided by the embodiments of the present disclosure, in the process of forming the layer structure, after the layer solution is formed on the substrate, the temperature of the layer solution is lowered at first for low-temperature solidification, then the solvent in the solidified layer solution is removed by a sublimation process. Compared with the roasting and film forming process via a thermal evaporation process, the phenomenon of "coffee ring" is eliminated, so that the formed layer structure has a uniform thickness, and the uniformity of the formed layer structure (e.g. the quantum dot layer) can be improved.

The foregoing is only the exemplary embodiments of the present disclosure and not intended to limit the scope of the present disclosure. All the changes or alternations which may be readily contemplated by an ordinary skill in the art within the technical scope disclosed by the embodiments of the present disclosure shall fall within the scope of the present disclosure.

The present application claims priority to the Chinese patent application No. 201610028987.7 filed on Jan. 15, 2016 and entitled "Layer Structure, Manufacturing Method thereof, Display Substrate, Backlight and Display Device", which is incorporated herein by reference in its entirety.

What is claimed is:

1. A method for manufacturing a layer structure, comprising:
    forming a layer solution on a substrate;
    solidifying the layer solution by lowering the temperature of the layer solution;
    forming the layer structure by removing a solvent in the solidified layer solution via a sublimation process; and
    raising the temperature of the layer solution, wherein the raised temperature is lower than the solidifying point of the layer solution; and after forming the layer structure by removing the solvent in the solidified layer solution via the sublimation process, forming a pattern by etching the layer structure via a patterning process.

2. The method according to claim 1, further comprising:
    forming the layer solution on the substrate by inkjet printing or roll-to-roll printing.

3. The method according to claim 1, further comprising:
    forming the layer structure by removing the solvent in the layer solution via the sublimation of the solidified layer solution in a vacuum.

4. The method according to claim 3, wherein the vacuum degree of the vacuum is 0.1-20 mbar.

5. The method according to claim 1, wherein the layer solution is a quantum dot solution.

6. The method according to claim 5, wherein the solvent in the layer solution at least includes one solvent from water, ethanol or glycerin.

7. The method according to claim 6, wherein the lowered temperature of the layer solution is in a range from 0 to 50 Celsius degrees.

8. The method according to claim 1, further comprising:
    forming the layer solution with a pattern on the substrate.

9. The method according to claim 8, further comprising:
    forming the layer solution on the substrate by inkjet printing or roll-to-roll printing.

10. The method according to claim 9, further comprising:
    forming the layer structure by removing the solvent in the layer solution via the sublimation of the solidified layer solution in a vacuum.

11. The method according to claim 10, wherein the vacuum degree of the vacuum is 0.1-20 mbar.

* * * * *